INVENTOR
Akio Yamashita

BY
Stevens, Davis, Miller & Mosher
ATTORNEYS

INVENTOR
Akio Yamashita
BY
Stevens, Davis, Miller & Mosher
ATTORNEYS

Feb. 28, 1967 AKIO YAMASHITA 3,307,089

SEMICONDUCTOR DEVICE SHOWING THE EFFECT OF STORING CHARGES OF SINGLE POLARITY

Filed March 10, 1964 3 Sheets-Sheet 3

INVENTOR

Akio Yamashita

BY

Stevens, Davis, Miller & Mosher

ATTORNEYS

3,307,089
SEMICONDUCTOR DEVICE SHOWING THE EFFECT OF STORING CHARGES OF SINGLE POLARITY

Akio Yamashita, Ikeda-shi, Japan, assignor to Matsushita Electric Industrial Co., Ltd., Osaka, Japan, a corporation of Japan Filed Mar. 10, 1964, Ser. No. 350,833
Claims priority, application Japan, Mar. 16, 1963, 38/14,538; May 2, 1963, 38/23,219, 38/23,220; June 17, 1963, 38/32,395; Sept. 21, 1963, 38/50,994, 38/50,995; Oct. 25, 1963, 38/57,735; Oct. 28, 1963, 38/58,709; Nov. 30, 1963, 38/64,963; Dec. 4, 1963, 38/65,971; Dec. 16, 1963, 38/68,418; Dec. 23, 1963, 38/70,259
6 Claims. (Cl. 317—234)

The present invention relates to electrical devices, and more particularly to a semiconductor device which comprises a semiconductor brought into contact with a mixture of an electrical insulator and another semiconductor showing the effect of storing charges of single polarity.

Heretofore, there has been proposed a thin film active element in which a semiconductor is brought into contact with an electrical insulator so as to take advantage of a tunnel effect or a field effect transistor which takes full advantage of a P-N junction. There has also been proposed a thin film transistor which includes cadmium sulfide brought into contact with an electrical insulator. Any of these devices, however, take advantage of the field effect and an inorganic material such as SiO is solely used as the insulator incorporated therein.

The primary object of the invention is to provide a semiconductor device which offers new and improved means and method of converting and controlling an electrical signal or electrical energy, and which comprises a mixture of at least a first semiconductor and a first electrical insulator, a second semiconductor brought into contact with the mixture, and an electrode disposed over the mixture on the opposite side of the second semiconductor through a second electrical insulator.

Another object of the invention is to provide a semiconductor device of said character in which the mixture further includes a fluorescent body therein in order to offer new and improved means and method of converting and controlling an electrical signal or electrical energy by means of light.

Another object of the invention is to provide a semiconductor device of said character in which a ferroelectric substance is added to the mixture of the semiconductor and the insulator in order to offer new and improved means and method of further effectively converting and controlling an electrical signal or electrical energy.

A further object of the invention is to provide a semiconductor device of said character in which the mixture further includes therein a metal which, in combination with the semiconductor, produces a photoelectromotive force to thereby obtain a new and improved means and method of converting and controlling an electrical signal or electrical energy by means of light.

Still another object of the invention is to provide a semiconductor device of said character in which a rectifying layer is provided on the second semiconductor to thereby obtain a new and improved means and method of converting and controlling an electrical signal or electrical energy.

There are other objects and particularities of the invention which will become obvious from the following description with reference to the accompanying drawings, in which.

The invention will now be described in detail with reference to the drawings.

Figure 1:
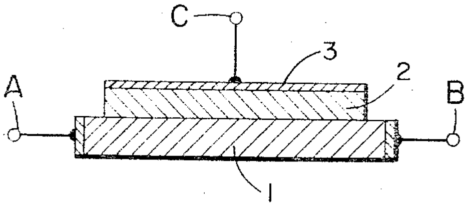
FIG. 1 is a schematic sectional view of a prior semiconductor device.

The aforedescribed thin film active element of prior design based on the tunnel effect utilizes a flow of carriers through an insulator, while other conventional devices invariably have three electrode terminals as shown in FIG. 1. The conventional device shown in FIG. 1 comprises a semiconductor 1, an electrical insulator or a P- or N-type semiconductor layer 2 depending on a thin film transistor or a field effect transistor and an electrode 3. A source electrode A and a drain electrode B are disposed on opposite sides of the transistor 1, while symbol C denotes a gate electrode. In any thin film transistor and field effect transistor, a flow of carriers between the electrodes A and B is controlled by an electric field across the electrodes A and C.

According to the invention, however, a mixture of at least a semiconductor and an electrical insulator is used in place of the insulator or the P- or N-type layer employed in the prior device shown in FIG. 1.

The semiconductor device of the invention is characterized by its unique structure in which such mixture of at least a first semiconductor and an insulator is brought into contact with second semiconductor. The semiconductor forming one component of the mixture is a well-known material such as Se, $Cu_2O$, NiO, ZnO, PbO, CdS, Si, Ge, ZnSe or anthracene, and the insulator forming another component of the mixture is such a material as glass, porcelain, sulfur, silicone resin, polyvinyl chloride, polyvinyl acetate, epoxy resin, polyvinyl butylate or wax. Various methods may be considered to prepare the mixture from these materials. One of the methods is to mix the semiconductor with an insulator of organic nature such as the resin or wax, while another method is to mix the semiconductor with an insulator of inorganic nature such as glass, porcelain or sulfur. Further, a fluorescent body such as ZnS, (Zn, Cd)S or $ZnSiO_4$ or a ferroelectric substance such as $BaTiO_3$ or $SrTiO_3$ may be added to the mixture. Still further, a metal which develops a photovoltaic effect through contact with the semiconductor in the mixture may be added.

Hereinunder, description will be made wtih regard to basic properties of a mixture of a semiconductor and an insulator. When D.C. voltage is applied to a common insulator in contact with an electrode, an electric charge of the opposite polarity to that of the electrode is produced at the surface of the insulator at which it is in contact with the electrode. When, however, D.C. voltage is applied to a mixture of a semiconductor and an insulator, an electric charge of the same polarity with that of an electrode with which the mixture is in contact is stored in the mixture.

Figure 2:
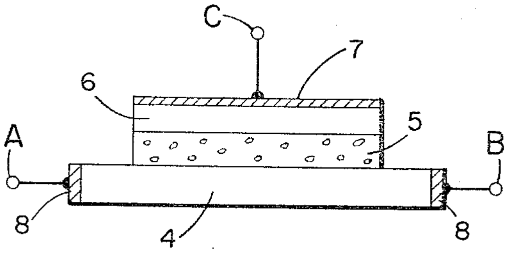
FIG. 2 is a schematic sectional view of a basic form of a semiconductor device of the invention.
Figure 3:
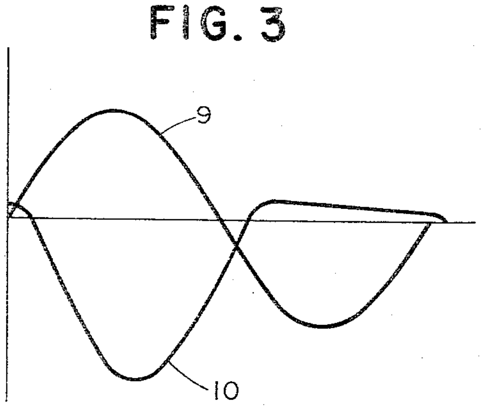
FIG. 3 is a graphic illustration of a relation between wave forms of an input A.C. voltage and an output rectified current.

FIG. 2 shows a basic structure of the semiconductor device of the invention in which the mixture of the semiconductor and the insulator, having the above-described characteristics, is brought into contact with a semiconductor. In FIG. 2, the semiconductor is shown at 4, while the mixture of the semiconductor and the insulator is designated by numeral 5. Reference numerals 6, 7 and 8 denote an insulator, an electrode disposed on the insulator, and electrodes in contact with the semiconductor 4, respectively. With such arrangement, the charges in the mixture 5 exert an influence on carriers within the semiconductor 4 and an entirely new phenomenon is thereby caused. Suppose now that the semiconductor 4 is in the form of N-type silicon having a resistivity of 20 Ω/cm., and the mixture 5 includes a P-type oxide semiconductor in the form of $Cu_2O$ and an insulator in the form of epoxy resin, while a polyethyleneterephthalate film, a nickel plate and nickel-plated films are used as the insulator 6, electrode 7 and eletcrodes 8, respectively. When now A.C. voltage is applied across terminals A and C, an electromotive force is generated between terminals A and B and a half-wave rectified current flows thereacross. In FIG. 3, a curve 9 shows a wave form of the A.C. voltage applied across the terminals A and C, while a curve 10 shows a wave form of the current caused to flow across the terminals A and B. The wave form of half-wave rectification is invariably obtained irrespective of any type of semiconductors included in the mixture 5. Further, a better rectifying characteristic is obtained at a higher frequency of the A.C. voltage. Thus, it is an astonishing fact that the rectification is made possible by the charge storage effect of the invention without employing any rectifying layer.

Figure 4:
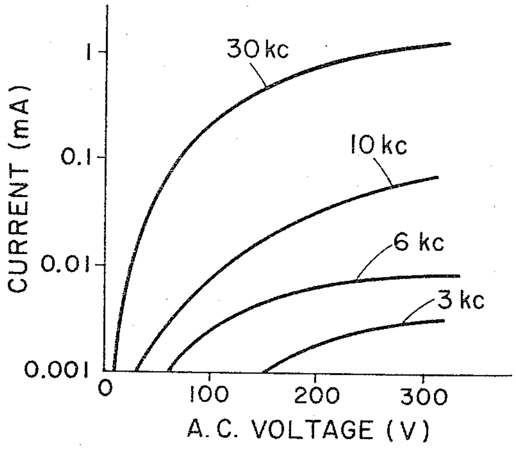
FIG. 4 is a graphic illustration between the current and A.C. voltage at various frequencies.

FIG. 4 shows a relation between a value of current flowing across the terminals A and B and A.C. voltage at various frequencies. It will be seen that a greater current is obtained at higher A.C. voltage and frequencies.

It is presumed that such phenomenon is caused by a non-equilibrium state of the charges in the semiconductor 4. Or more precisely, when the terminal C is at a potential higher than that of the terminal A, electrons being the majority carriers in the semiconductor 4 are stored in the mixture 5 and at the same time the condition is such that the electron density is high at the side of the terminal A and low at the side of the terminal B. Thus, the electrons move from the high density side toward the low density side, causing a flow of current. Then, in an opposite half cycle, the electron density is now high at the side of the terminal B and low at the side of the terminal A, and the electrons tend to move from the side of the terminal B toward the terminal A. In this case, however, the flow of the electrons cannot almost take place due to the greater amount of electrons stored in the mixture 5 on the side of the terminal A. Therefore, the current can hardly flow.

The amount of charge storaged in the mixture can be varied by illumination thereon when a fluorescent body is added to the mixture 5. It is therefore possible to vary the electromotive force in the semiconductor 4. Description will now be made with regard to a manner of varying the amount of charge in the mixture alone.

Figure 5:
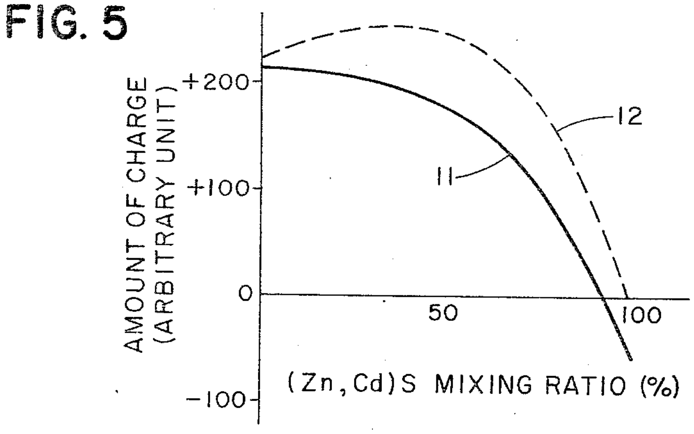
FIGS. 5–10 are graphic illustrations of various characteristics of the device of FIG. 2 with mixtures of different constituents.

FIG. 5 shows a relation between an amount of charge stored in the mixture 5 and a ratio of (Zn, Cd)S to the mixture consisting of (Zn, Cd)S plus $Cu_2O$ plus the silicone resin. Curves 11 and 12 therein indicate an amount of charge when a voltage of 600 volts is applied to the device in a dark place for 60 seconds, and an amount of charge when the voltage of 600 volts is applied in a dark space for 60 seconds and subsequently the device is illuminated with the light of 50 luxes for 60 seconds, respectively. The curve 12 shows the result of illumination on the device having been charged as shown by the curve 11. It will be seen that the addition of (Zn, Cd)S is effective to increase the amount of charge. This is because the charges of the polarity opposite to that of $Cu_2O$ which are formed on the surface of the mixture 5 by the internal polarization of (Zn, Cd)S are extinguished by the application of light, causing an apparent increase in the amount of charge.

Figure 6:
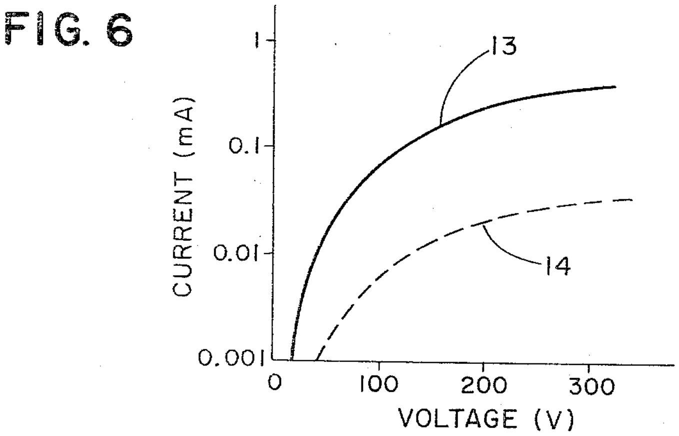

When now the mixture 5 having such characteristics is brought into contact with the semiconductor 4 of FIG. 2 and transparent materials are employed to form the electrode 7 and the insulator 6 therein, it is possible to vary the amount of charge in the mixture 5 by illumination applied through the transparent electrode 7. Further, in the semiconductor device as shown in FIG. 2, illumination applied through the transparent electrode 7 while applying voltage across the terminals A and C will result in an increase of the charges of opposite polarity by (Zn, Cd)S, while the charges of the same polarity by $Cu_2O$ will remain unchanged. Therefore, the amount of charge apparently decreases in a dark space. Thus, a smaller electromotive force appears across the terminals A and B. The result thereof is as shown in FIG. 6. A curve 13 therein indicates a relation between current flowing across the terminals A and B and applied A.C. voltage when A.C. voltage at 30 kilocycles is applied across the terminals A and C. A curve 14 indicates a similar relation when light of 100 luxes is illuminated under the same A.C. voltage, and it will be seen that the current is greatly reduced by the illumination.

Figure 7:
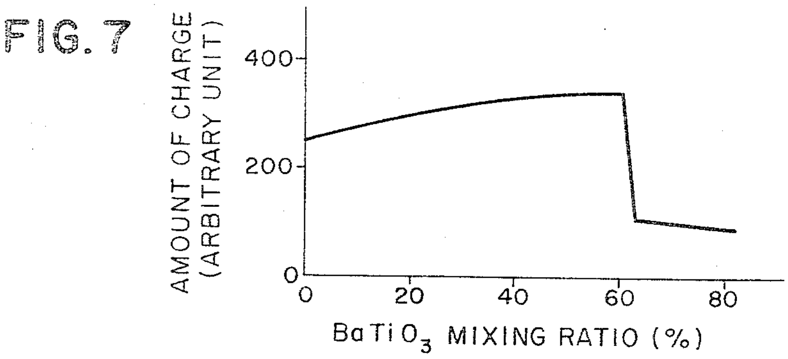

A further increase in the amount of charge storaged in the mixture of the semiconductor and the insulator can be effected by addition of a ferroelectric substance thereto, and it is therefore possible to increase the electromotive force appearing across the terminals A and B. The semiconductor of P-type in the form of NiO, is mixed at various ratios with the ferroelectric substance in the form of $BaTiO_3$ and silicone resin is added thereto as the insulator. The mixture of these materials is coated on a polyethyleneterephthalate film to obtain a structure as shown in FIG. 2 and voltage is applied thereto. FIG. 7 shows a variation of an amount of stored charge when the ratio of $BaTiO_3$ to NiO is varied. It will be seen that the amount of charge increases at a ratio of $BaTiO_3$ of less than 60%, but abruptly decreases at a ratio exceeding 60%. Similar tendency is obtained with other ferroelectric substances.

Figure 8:
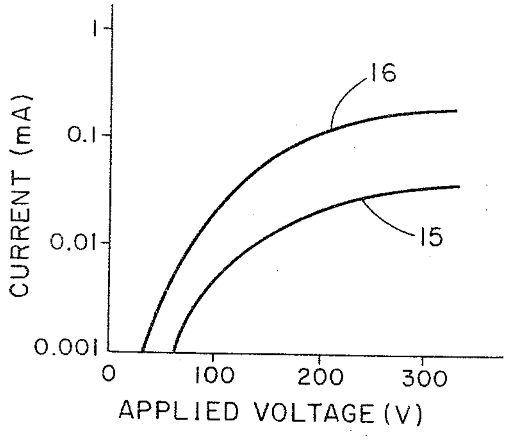

The semiconductor, NiO, and the ferroelectric substance, $BaTiO_3$, are mixed at a ratio of 6:4 and the mixture is dispersed in polystyrene. This layer is brought into contact with a wafer of silicon, which is a semiconductor, to obtain a structure as shown in FIG. 2. For the sake of comparison, a sample consisting of NiO alone and completely devoid of $BaTiO_3$ was prepared. FIG. 8 shows a variation of current flowing across the terminals A and B when A.C. voltage at 10 kilocycles is applied across the terminals A and C. Curves 15 and 16 therein represent the characteristic of the sample without $BaTiO_3$ therein and the characteristic of the sample with $BaTiO_3$, respectively. It will be thus seen that a greater current is obtained by the addition of $BaTiO_3$. In the inventor's opinion, it is considered that a great amount of charge can be stored in the mixture 5 by the inclusion of the ferroelectric substance therein and the tendency toward producing an electromotive force is intensified to cause the flow of a greater current. Further, by the addition of both of the afore-described fluorescent bodies and the ferroelectric substance into the mixture, the characteristic of variation of the amount of charge by the fluorescent body is overlapped on the characteristic of the ability of the ferroelectric substance to provide the greater amount of charge.

Figure 9:
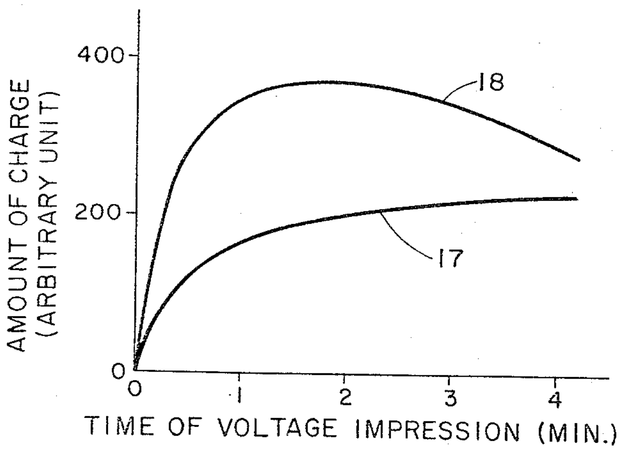

It is further possible to vary the characteristic of the semiconductor device by adding a metal to the mixture, of a semiconductor and an insulator. The metal is used to generate a photovoltaic effect in the contact region between the metal and the semiconductor. $Cu_2O$ is now selected as the semiconductor which develops such photovoltaic effect. A mixture is prepared by mixing 65% of $Cu_2O$ in a form of powder of 2 to 3 microns, 5% of Cu in a form of powder of 2 to 3 microns and 30% of silicone resin. The mixture is coated on polyethyleneterephthalate films, and samples having a structure as shown in FIG. 2 were prepared. Voltage was applied to the samples in both a dark space and a light space. A transparent conductive glass electrode was used as the electrode 7 in FIG. 2 to see the effect of illumination on the sample. FIG. 9 shows a relation between a time of voltage application and an amount of charge stored in the mixture when a voltage of 600 volts was applied with the transparent electrode 7 operating positive. A curve 17 therein indicates the characteristic in a dark place, while a curve 18 the characteristic when illuminated with light of 100 luxes simultaneously with the application of voltage. As will be apparent from FIG. 9, the amount of stored charge increases with the illumination.

Figure 10:
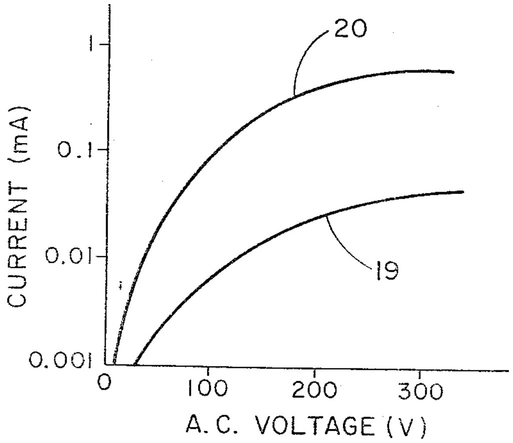

The following characteristic can be obtained when the mixture having such characteristic is brought into contact with a semiconductor. A semiconductor in the form of N-type silicon is employed to form a structure as shown in FIG. 2. Needless to say, the electrode 7 and the insulator 6 are of a light transmission nature. When A.C. voltage at 1 kilocycle is applied across the terminals A and C, current flows across the terminals A and B of the semiconductor. FIG. 10 shows a variation of the current flowing across the terminals A and B relative to the applied voltage. A curve 19 therein indicates the characteristic when the A.C. voltage is applied in a dark space, while a curve 20 indicates the characteristic when illuminated with light of 100 luxes simultaneously with the application of the A.C. voltage. It will be seen that the current increases by the illumination. It is considered that a photovoltaic effect is caused by the illumination owing to the combination of $Cu_2O$-Cu and an increased amount of charge is thereby obtained. In the inventor's opinion, such increased amount of charge is obtained by the charges drawn out of the semiconductor by an electric field established by the photovoltaic effect, not by the charges generated in the mixture layer by the photovoltaic effect.

Description will hereinunder be made with regard to a case of providing a rectifying layer on the semiconductor 4 in the device of FIG. 2. Generally, a semiconductor diode takes the form of a P-N junction type diode or a point-contact diode in which a metal is brought into rectifying contact with a semiconductor. Such a diode invariably has a rectifying characteristic in its V–I characteristics. The V–I characteristics are determined by such factors as materials and methods of manufacturing the elements. Now, an electrode A is brought into rectifying contact with a semiconductor in a structure as shown in FIG. 2, or a P-N junction is formed thereat. Then, the rectifying characteristic between terminals A and B is made to vary by applying a signal across terminals A and C. A similar result can be obtained by, for example, applying a signal voltage across the terminals B and C in FIG. 2, without applying a signal voltage across the rectifying layer. It has, however, been found out that a greater variation in the diode characteristic can be obtained by applying the signal voltage across the rectifying layer.

Figure 11:
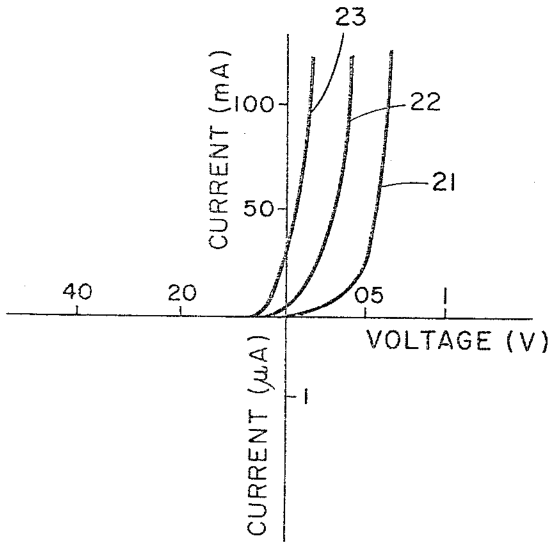
FIG. 11 is a graphic illustration of rectifying characteristic obtained in the device having the structure as shown in FIG. 2.

Aluminum is alloyed to one end of N-type silicon (with resistivity of 0.2 Ω/cm.) to form a P-N junction and the electrode A is provided thereat. A mixture of a P-type oxide semiconductor, $Cu_2O$, and polystyrene is brought into contact with the N-type silicon forming the base, and a polyethylenetelephthalate film is superposed on the mixture. Aluminum is deposited by vacuum evaporation on the polyethylenetelephthalate film to act as the electrode C. The other end of the N-type silicon is plated with gold and the electrode B is brought into ohmic contact therewith by being soldered thereto. For effective operation, a signal such as an A.C. pulse may preferably by applied across the terminals A and C. The rectifying characteristic across the terminals A and B of the device when no signal voltage is applied across the terminals A and C is as shown by a curve 21 in FIG. 11. Curves 22 and 23 show the rectifying characteristic across the terminals A and B when A.C. voltages of 50 and 100 volts at 1 kilocycle are applied across the terminals A and C, respectively. It will be seen that a greater forward current is obtained in its rectifying characteristic at an increased signal voltage. The forward characteristic likewise varies with a variation in the frequency of the input signal. Although the P-N junction is employed herein, it will be understood that a similar effect may be obtained when, for example, a gold wire is brought into point or rectifying contact with a semiconductor such as Si or Ge. The effect of the invention may be the same when a compound semiconductor such as GaAs is used instead of Si and Ge. GaAs is especially advantageous in that it can be used up to an ultra-high frequency range. From the foregoing detailed description, it will be understood that semiconductor devices of various novel functions can be derived from the basic constitution of the invention comprising a mixture of a semiconductor and an insulator brought into contact with a semiconductor. The embodiments described in the invention are merely illustrative and various changes and modification may be made without departing from the spirit of the invention.

What is claimed is:

1. A semiconductor device composed of a mixture of at least a first semiconductor and a first electrical insulator, a second semiconductor brought into contact with said mixture, a second electrical insulator directly disposed over said mixture on the opposite side from said second semiconductor, and an electrode in contact with said second electrical insulator.

2. A semiconductor device according to claim 1 in which said mixture further includes a fluorescent material therein.

3. A semiconductor device according to claim 1 in which said mixture further includes a ferroelectric substance therein.

4. A semiconductor device according to claim 1 in which said mixture further includes therein a fluorescent body and a ferroelectric substance.

5. A semiconductor device according to claim 1 in which said mixture further includes a metal which generates a photoelectromotive force in combination with said first semiconductor.

6. A semiconductor device according to claim 1 in which a rectifying layer is provided on said second semiconductor.

No references cited.

JOHN W. HUCKERT, *Primary Examiner.*

M. EDLOW, *Assistant Examiner.*